US012785036B2

(12) United States Patent
Fish

(10) Patent No.: US 12,785,036 B2
(45) Date of Patent: Nov. 3, 2026

(54) ION SOURCE WITH WIRE FORM METAL DOPANT

(71) Applicant: Applied Materials, Inc., Santa Clara, CA (US)

(72) Inventor: Roger B. Fish, Bedford, MA (US)

(73) Assignee: Applied Materials, Inc., Santa Clara, CA (US)

( * ) Notice: Subject to any disclaimer, the term of this patent is extended or adjusted under 35 U.S.C. 154(b) by 379 days.

(21) Appl. No.: 18/380,448

(22) Filed: Oct. 16, 2023

(65) Prior Publication Data

US 2025/0125119 A1 Apr. 17, 2025

(51) Int. Cl.
*H01J 37/317* (2006.01)
*H01J 37/08* (2006.01)

(52) U.S. Cl.
CPC .......... *H01J 37/3171* (2013.01); *H01J 37/08* (2013.01); *H01J 2237/24535* (2013.01); *H01J 2237/24585* (2013.01)

(58) Field of Classification Search
None
See application file for complete search history.

(56) References Cited

U.S. PATENT DOCUMENTS 4,046,666 A * 9/1977 McClanahan ........... H01J 37/08 204/192.15
6,664,739 B1 * 12/2003 Kishinevsky ........... H01J 37/08 315/111.41
8,937,003 B2 * 1/2015 Perel ..................... C23C 14/564 438/513
11,404,254 B2 8/2022 Patel et al.
2002/0130270 A1 * 9/2002 Reyes ..................... H01J 37/08 250/423 R
2004/0107907 A1 * 6/2004 Collins ............. H01J 37/32082 118/723 I
(Continued)

FOREIGN PATENT DOCUMENTS

KR 20010019004 A * 3/2001 ............. H01J 37/08
NL 8400344 A * 9/1985 ............. H01J 37/08
(Continued)

OTHER PUBLICATIONS

English machine translation for NL-8400344-A (Year: 1985).*
English machine translation for KR-20010019004-A (Year: 2001).*
English machine translation for RU-2647887-C1 (Year: 2018).*

*Primary Examiner* — David E Smith
*Assistant Examiner* — Alina Kaliszewski
(74) *Attorney, Agent, or Firm* — Nields, Lemack & Frame, LLC

(57) ABSTRACT

An ion source that includes a material delivery system to deliver a metal dopant in the form of a wire to the ion source is disclosed. The wire is introduced through an opening in one wall of the arc chamber and is sputtered or chemically etched by the plasma. The rate at which the wire is delivered may be controlled so as to maintain a desired beam current without causing any liquid metal to be spilled in the arc chamber. In some embodiments, the wire may be heated or cooled prior to entering the ion source. In some embodiments, a dopant power supply may be employed to supply a bias voltage to the wire. A controller may be used to control various parameters associated with the metal dopant, including delivery rate, dopant voltage and dopant temperature.

18 Claims, 6 Drawing Sheets

(56) References Cited

U.S. PATENT DOCUMENTS

2005/0061989 A1* 3/2005 Taniguchi ............... H01J 37/08 250/425
2006/0118406 A1* 6/2006 Delahoy ............... C23C 14/228 204/192.12
2006/0138353 A1* 6/2006 Sasaki ................. H01J 37/3171 250/492.21
2008/0067412 A1* 3/2008 Vanderberg ............. H01J 27/08 250/427
2009/0008570 A1* 1/2009 Chen ....................... H01J 27/14 250/426
2010/0320395 A1* 12/2010 Hahto ..................... H01J 37/08 250/426
2011/0259366 A1* 10/2011 Sweeney ............. H01J 37/3171 134/22.13
2012/0048723 A1* 3/2012 Chaney ............... H01J 37/3171 204/192.12
2012/0119113 A1* 5/2012 Colvin .................... H01J 37/08 250/492.3
2012/0252195 A1* 10/2012 Jones ...................... C23C 14/52 257/E21.334
2018/0130630 A1* 5/2018 Tani ........................ H01J 37/30
2019/0122851 A1* 4/2019 Tieger ..................... H01J 37/08
2020/0157675 A1* 5/2020 Wright ................ C23C 14/3428
2020/0303154 A1* 9/2020 Bassom .............. H01J 37/3002
2021/0110995 A1* 4/2021 Patel ....................... H01J 37/08
2021/0375585 A1* 12/2021 Patel ..................... H01J 37/302
2023/0343558 A1* 10/2023 Bassom .................. H01J 37/08
2024/0035148 A1* 2/2024 Colvin .................... C23C 14/48
2024/0258118 A1* 8/2024 Banerjee ............. H01J 37/3171
2025/0118524 A1* 4/2025 Colvin .................... H01J 37/08

FOREIGN PATENT DOCUMENTS

RU 2647887 C1 * 3/2018 .............. H01J 37/08
WO WO-2018004880 A1 * 1/2018 .............. H01J 37/08

* cited by examiner

ION SOURCE WITH WIRE FORM METAL DOPANT

FIELD

Embodiments of the present disclosure relate to an ion source, and more particularly, an ion source that uses wire form metal dopants.

BACKGROUND

Various types of ion sources may be used to create the ions that are used in semiconductor processing equipment. For example, an indirectly heated cathode (IHC) ion source operates by supplying a current to a filament disposed behind a cathode. The filament emits thermionic electrons, which are accelerated toward and heat the cathode, in turn causing the cathode to emit electrons into the arc chamber of the ion source. The cathode is disposed at one end of an arc chamber. A repeller is typically disposed on the end of the arc chamber opposite the cathode. The cathode and repeller may be biased so as to repel the electrons, directing them back toward the center of the arc chamber. In some embodiments, a magnetic field is used to further confine the electrons within the arc chamber.

In certain embodiments, it may be desirable to utilize a feed material that is in solid form as a dopant species. However, there are issues associated with using solid feed materials with IHC ion sources. For example, vaporizers used with ion sources are difficult to operate at temperatures greater than 1200 Celsius. Further, there may be issues with heat shielding and condensation in the tubes that connect the vaporizer with the arc chamber. These issues may prevent the use of many solids in a vaporizer because their vapor pressure is too low at 1200 Celsius.

Other systems have utilized sputter targets that are typically ceramic materials that contain the dopant species. For example, if the dopant species is aluminum, the ceramic material may be alumina or aluminum nitride. However, the beam current associated with these sputter targets may be lower than desired.

Further, disposing a target that contains only the dopant metal, such as a block of aluminum, may be undesirable. Due to the low melting temperature of aluminum, the metal may melt or splatter, leaving deposits on the interior of the ion source, which may be problematic if the ion source is to be used to ionize other types of dopants at a later time.

Therefore, an ion source that may be used with a metal dopant material without these limitations would be beneficial. Further, it would be advantageous if the ion source was not contaminated by the metal dopant material.

SUMMARY

An ion source that includes a material delivery system to deliver a metal dopant in the form of a wire to the ion source is disclosed. The wire is introduced through an opening in one wall of the arc chamber and is sputtered or chemically etched by the plasma. The rate at which the wire is delivered may be controlled so as to maintain a desired beam current without causing any liquid metal to be spilled in the arc chamber. In some embodiments, the wire may be heated or cooled prior to entering the ion source. In some embodiments, a dopant power supply may be employed to supply a bias voltage to the wire. A controller may be used to control various parameters associated with the metal dopant, including delivery rate, dopant voltage and dopant temperature.

According to one embodiment, an indirectly heated cathode ion source is disclosed. The indirectly heated cathode ion source comprises an arc chamber, comprising a plurality of electrically conductive side walls connecting a first end and a second end; an indirectly heated cathode disposed on the first end of the arc chamber; an opening formed on one of the plurality of electrically conductive side walls; a material delivery device to deliver a metal dopant in a form of a wire to the arc chamber; and a conduit through which the wire passes as the wire travels to an interior of the arc chamber through the opening in the arc chamber. In some embodiments, the indirectly heated cathode ion source comprises a temperature control device to heat or cool the metal dopant prior to entering the arc chamber. In some embodiments, the temperature control device contacts the conduit. In certain embodiments, the temperature control device comprises one or more heating elements. In certain embodiments, the temperature control device comprises one or more cooling elements. In some embodiments, the indirectly heated cathode ion source comprises a temperature sensor to measure a temperature of the metal dopant prior to entering the arc chamber. In some embodiments, the indirectly heated cathode ion source comprises a dopant power supply to apply a voltage to the metal dopant. In some embodiments, a diameter of the wire is between 20 and 70 mils. In some embodiments, the material delivery device comprises a spool on which the wire is wound and a motor for advancing the wire.

According to another embodiment, an indirectly heated cathode ion source is disclosed. The indirectly heated cathode ion source comprises an arc chamber, comprising a plurality of electrically conductive side walls connecting a first end and a second end; an indirectly heated cathode disposed on the first end of the arc chamber; an opening formed on the second end; a material delivery device to deliver a metal dopant in a form of a wire to the arc chamber; and a conduit through which the wire passes as the wire travels to an interior of the arc chamber through the opening in the arc chamber. In some embodiments, the indirectly heated cathode ion source comprises a temperature control device to heat or cool the metal dopant prior to entering the arc chamber. In some embodiments, the indirectly heated cathode ion source comprises a temperature sensor to measure a temperature of the metal dopant prior to entering the arc chamber. In some embodiments, the indirectly heated cathode ion source comprises a dopant power supply to apply a voltage to the metal dopant. In some embodiments, a diameter of the wire is between 20 and 70 mils.

According to another embodiment, an ion implanter is disclosed. The ion implanter comprises any of the indirectly heated cathode ion sources described above to generate an ion beam, and one or more beamline components to direct the ion beam toward a workpiece. In some embodiments, the ion implanter comprises a controller, wherein the controller controls at least one metal dopant related parameter, wherein the metal dopant related parameters include a delivery rate of the wire, a temperature of the wire and a voltage applied to the wire. In some embodiments, the ion implanter comprises a beam profiler to detect a beam current at a location near the workpiece, wherein the controller uses information from the beam profiler to control at least one of the metal dopant related parameters.

BRIEF DESCRIPTION OF THE FIGURES

For a better understanding of the present disclosure, reference is made to the accompanying drawings, which are incorporated herein by reference and in which.

DETAILED DESCRIPTION

As described above, vaporizers may be problematic at very high temperatures due to condensation and low vapor pressure. The present disclosure describes ion sources that may be utilized to mitigate these issues.

Figure 1:
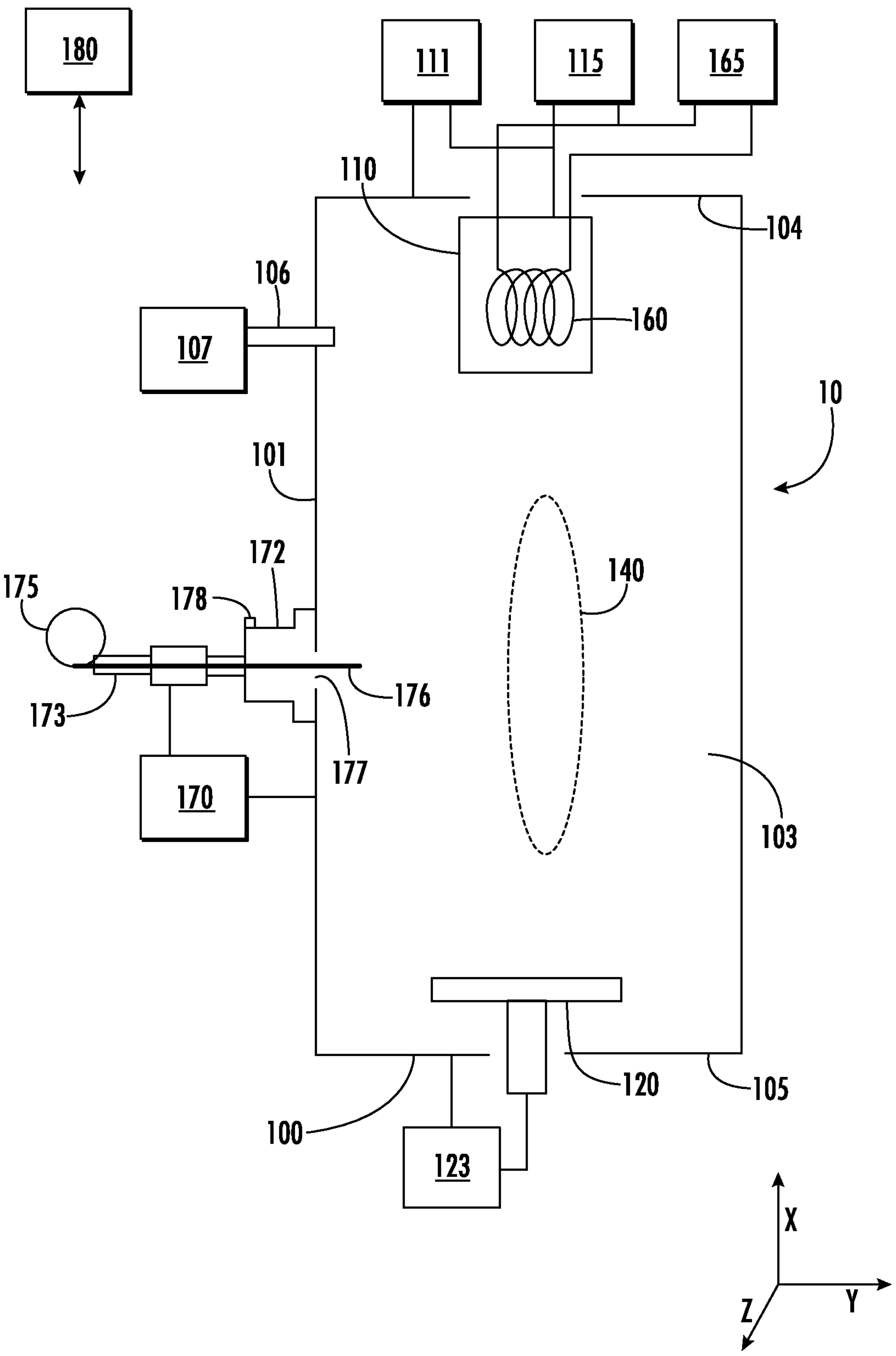
FIG. 1 is an indirectly heated cathode (IHC) ion source with a wire form metal dopant in accordance with one embodiment.

FIG. 1 shows a first embodiment of an IHC ion source 10 that overcomes the issues associated with metal dopant materials. The IHC ion source 10 includes an arc chamber 100, comprising two opposite ends, and side walls 101 connecting to these ends. The arc chamber 100 also includes a bottom wall and a top wall. The walls of the arc chamber 100 may be constructed of an electrically conductive material and may be in electrical communication with one another. A cathode 110 is disposed in the arc chamber 100 at a first end 104 of the arc chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons on its front surface into arc chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. This difference in voltage may be referred to as a bias voltage. In certain embodiments, the cathode 110 may be biased relative to the arc chamber 100, such as by arc power supply 111. This difference in voltage is referred to as the arc voltage. In other embodiments, the cathode 110 may be electrically connected to the arc chamber 100, so as to be at the same voltage as the side walls of the arc chamber 100. In these embodiments, arc power supply 111 may not be employed and the cathode 110 may be electrically connected to the side walls of the arc chamber 100. In certain embodiments, the arc chamber 100 is connected to electrical ground.

On the second end 105, which is opposite the first end 104, a repeller 120 may be disposed. The repeller 120 may be biased relative to the arc chamber 100 by means of a repeller bias power supply 123. In other embodiments, the repeller 120 may be electrically connected to the arc chamber 100, so as to be at the same voltage as the side walls 101 of the arc chamber 100. In these embodiments, repeller bias power supply 123 may not be employed and the repeller 120 may be electrically connected to the side walls 101 of the arc chamber 100. In other embodiments, the repeller 120 may be electrically floating. In still other embodiments, a repeller 120 is not employed.

The cathode 110 and the repeller 120 are each made of an electrically conductive material, such as a metal or graphite.

In certain embodiments, a magnetic field is generated in the arc chamber 100. This magnetic field is intended to confine the electrons along one direction. The magnetic field typically runs parallel to the side walls 101 from the first end 104 to the second end 105.

Disposed on one side of the arc chamber 100, referred to as the extraction plate 103, may be an extraction aperture 140. In FIG. 1, the extraction aperture 140 is disposed on a side that is parallel to the X-Y plane (parallel to the page).

Further, the IHC ion source 10 may be in communication with at least one gas source 107 through a gas inlet 106. The gas source 107 may supply an inert species, such as argon, an etching species, such as fluorine or a fluorine-containing gas, or a mixture of inert species and etching species.

In this embodiment, the metal dopant 176 is in the form of a wire, and is delivered to the arc chamber 100 through an opening 177 in a wall of the arc chamber 100.

The wire is introduced into the arc chamber 100 through the use of a material delivery device 175. The material delivery device 175 may include a motor and a spool. In one embodiment, the wire may be wound on a spool. The spool is in contact with the motor, such that rotation of the shaft of the motor causes corresponding rotation of the spool, which forces the metal dopant 176 to move through conduit 173 and through the opening 177 into the arc chamber 100. Note that the metal dopant 176 may be retracted by rotation of the motor in the opposite direction. Of course, other material delivery devices may be used. In another embodiment, a pinch roller device is utilized, where the wire is pulled from the spool and pushed into the arc chamber 100 by rotation of a roller. The roller, driven by a motor, has the wire pinched between the roller and a fixed surface and the friction of the roller to the wire pushes the wire in or out of the conduit 173 as the roller rotates. In another embodiment, a linear motor is used, where a driving surface would move forward, or reverse, and as in the case of the pinch roller in the previous embodiment, would push or pull the wire to the arc chamber 100.

The diameter of the wire may be between 20 and 70 mils, depending on the stiffness of the metal, although other diameters are also possible.

The inner diameter of the conduit 173 is slightly larger than the diameter of the wire, such that the metal dopant 176 is guided through the conduit 173 toward the arc chamber 100. In some embodiments, the conduit 173 may comprise an outer jacket, which may be made from a polymer. Within the outer jacket may be a spiral wire wound tube, which may be any suitable metal having a high melting point. The interior of the spiral wire wound tube may be lined to allow the metal dopant 176 to smoothly move within the conduit 173. This interior liner may be a high temperature material, such as a polymer or Kapton.

A temperature control device 172 is located outside the arc chamber 100 but in proximity to the arc chamber. In some embodiments, the temperature control device 172 may include cooling elements. In one embodiment, the cooling elements include cooling channels through which a cooling fluid, such as deionized water, air, nitrogen, or another fluid, may pass through so as to maintain the metal dopant 176 within a desired temperature range as it enters the arc chamber 100. In other embodiments, the cooling elements may be in the form of solid state cooling devices, such as Peltier coolers. The use of cooling elements may be beneficial when using metal dopants that have a relatively low melting point, such as aluminum, where it is desirable to maintain the metal dopant 176 in solid form as it enters the arc chamber 100. In other embodiments, the temperature control device 172 may include one or more heating elements, such as solid state or resistive heaters. In these embodiments, the temperature control device 172 is used to elevate the temperature of the metal dopant 176 before it enters the arc chamber 100. This may be beneficial when using metal dopants that have a relatively high melting point, such as platinum. In other embodiments, the temperature control device 172 may have the ability to heat or cool the metal dopant 176, as dictated by the controller 180. The temperature control device 172 may be in direct contact with the metal dopant 176, or may be in contact with the conduit 173, which in turn transfers heat to or from the metal dopant 176. For example, the temperature control device 172 may wrap around the conduit 173 a plurality of times and contain one or more heating elements or cooling elements. In another embodiment, the temperature control device 172 may wrap directly around the wire a plurality of times so as to directly contact the metal dopant 176.

In certain embodiments, a temperature sensor 178 is disposed outside the arc chamber 100 proximate to the metal dopant 176. In some embodiments, the temperature sensor 178 may be disposed on the temperature control device 172. The temperature sensor 178 may be a thermocouple or a resistive temperature device (RTD).

Additionally, a dopant power supply 170 may be used to provide a bias voltage to the metal dopant 176. This bias voltage may be used to change the rate at which the metal dopant 176 is consumed by the plasma. Additionally, in certain embodiments, the dopant power supply 170 also has the ability to sense the current being supplied to the metal dopant 176. In one embodiment, an opening is created in the conduit 173 and an electrical contact, which is in electrical communication with the dopant power supply 170, is located in this opening. This electrical contact is in physical contact with the metal dopant 176 as it is delivered to the arc chamber 100.

Note that the system described herein may be used with a variety of metal dopants, including aluminum, indium, magnesium, platinum, tin, nickel, tungsten and alloys of these metals.

A controller 180 may be in communication with one or more of the power supplies such that the voltage or current supplied by these power supplies may be modified. The controller 180 may also be in communication with the material delivery device 175, the temperature control device 172, the temperature sensor 178 and the dopant power supply 170. The controller 180 may include a processing unit, such as a microcontroller, a personal computer, a special purpose controller, or another suitable processing unit. The controller 180 may also include a non-transitory storage element, such as a semiconductor memory, a magnetic memory, or another suitable memory. This non-transitory storage element may contain instructions and other data that allows the controller 180 to perform the functions described herein.

Figure 2:
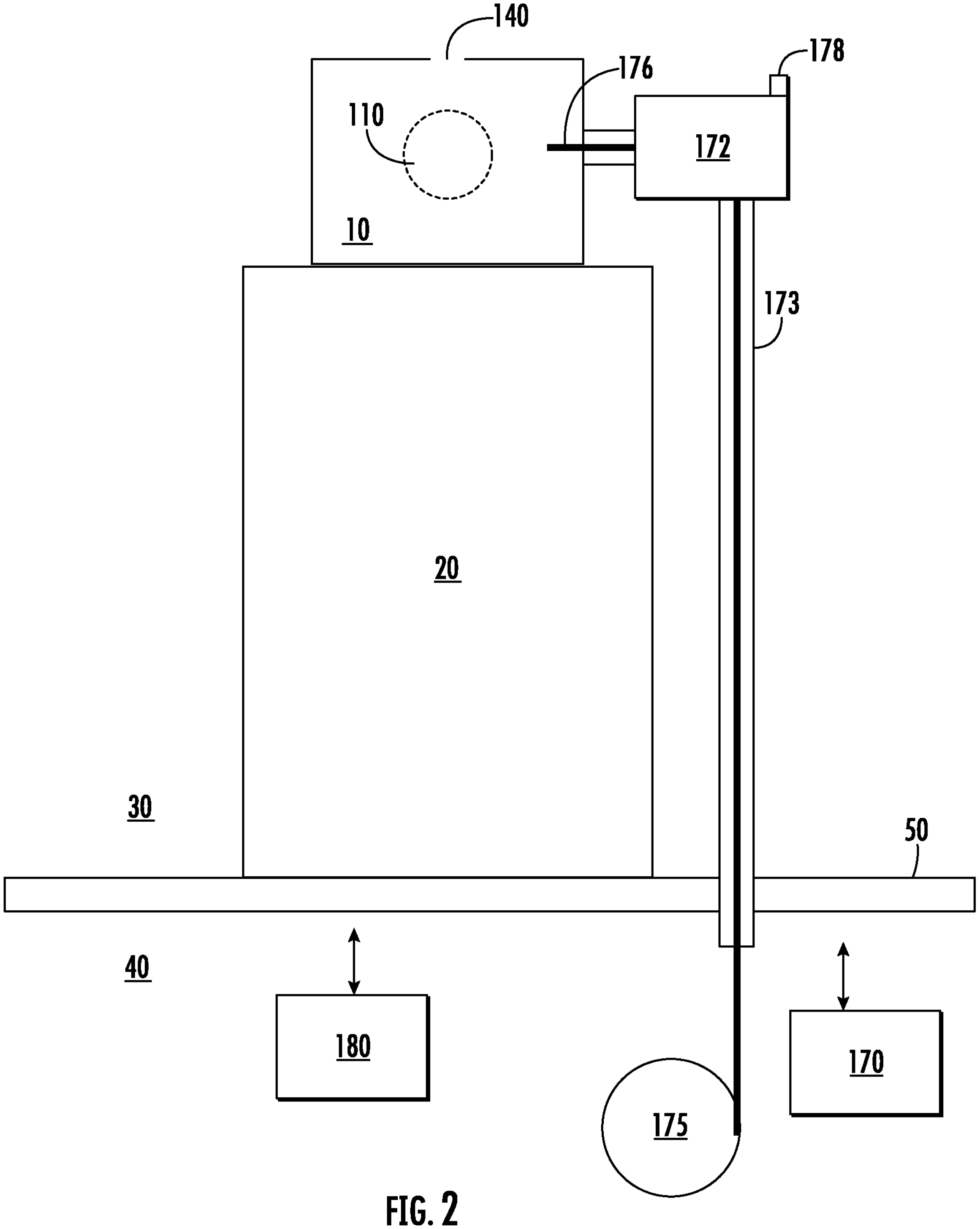
FIG. 2 shows the ion source of FIG. 1 and the base.

FIG. 2 is a view of the IHC ion source 10 of FIG. 1 disposed on a base 20. The IHC ion source 10 and much of the base 20 is disposed in a vacuum chamber 30. A chamber wall 50 separates the vacuum chamber 30 from the atmospheric environment 40. In certain embodiments, the material delivery device 175 is disposed in the atmospheric environment 40, with the conduit 173 passing through the chamber wall 50 and into the vacuum chamber 30. The metal dopant 176 travels within the conduit 173 from the atmospheric environment 40 to the arc chamber 100. The temperature control device 172 is disposed in the vacuum chamber, so as to be close to the arc chamber 100. Similarly, the temperature sensor 178 is also disposed in the vacuum chamber, close to where the metal dopant 176 enters the arc chamber 100. Other components, such as controller 180 and the dopant power supply 170 are located in the atmospheric environment 40. Wires from these components may pass through a vacuum feedthrough to enter the vacuum chamber 30.

By disposing the material delivery device 175 in the atmospheric environment 40, it becomes easier to replenish, remove or replace the metal dopant 176 without having to break vacuum.

In certain embodiments, where the dopant supply is in the atmospheric environment 40, a vacuum seal may be located at the entrance to the conduit 173 or where it passes through the chamber wall 50. In certain embodiments, seals may be disposed on the entrance and exit to the conduit 173, and the region between the entrance and exit seals may be differentially pumped. The pumped region may be singular or multiple. Metal or polymer seals may be disposed at both ends and/or within the sealed region.

Figure 3:
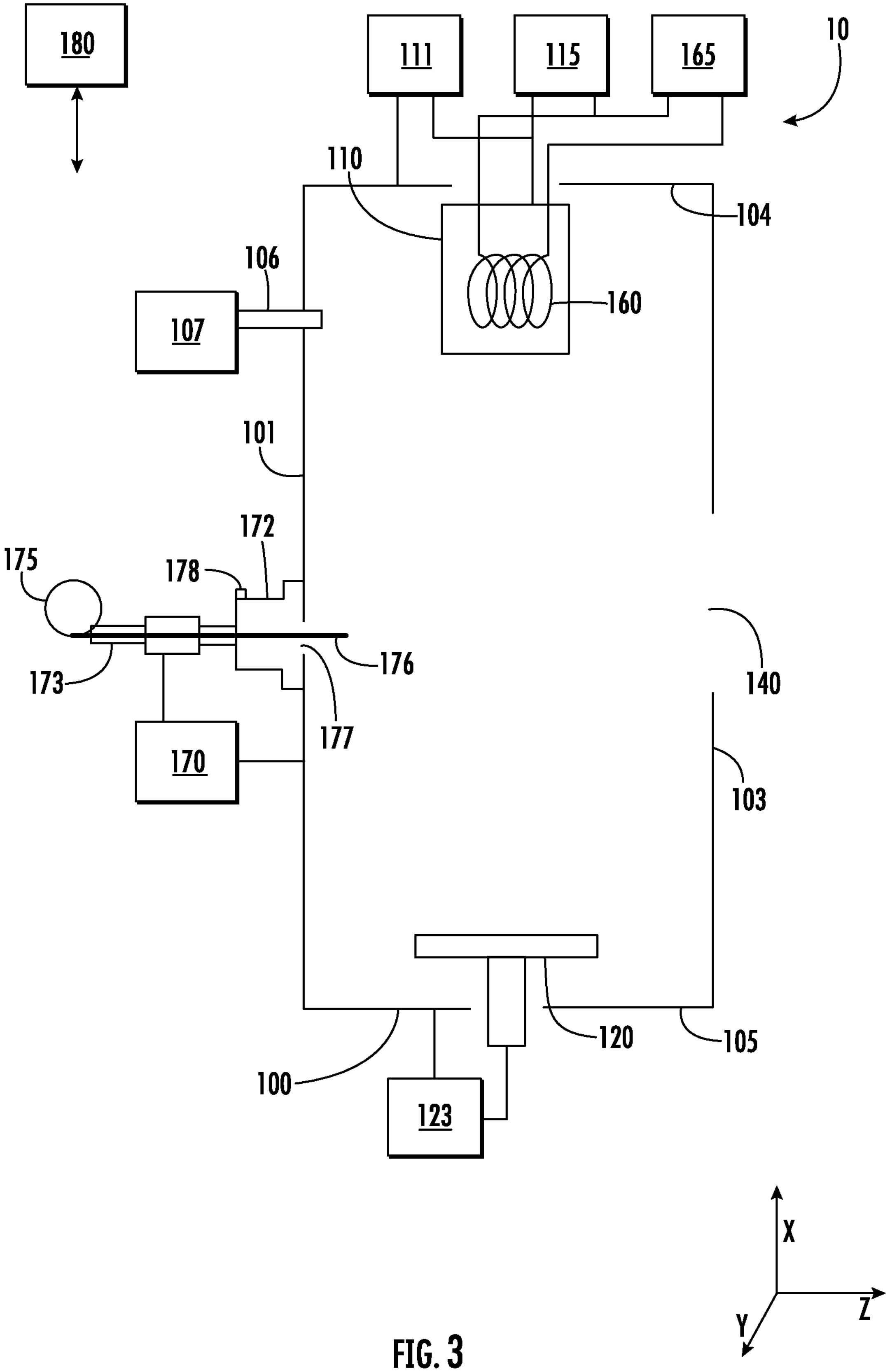
FIG. 3 is an indirectly heated cathode (IHC) ion source with a wire form metal dopant in accordance with a second embodiment.

Note that while FIG. 1 shows the metal dopant 176 entering the arc chamber 100 through the side wall 101 that is adjacent to the extraction plate 103, other embodiments are also possible. FIG. 3 shows an embodiment where the metal dopant enters on the side wall 101 that is opposite the extraction plate 103. In this embodiment, the opening 177 is located on the bottom wall of the IHC source. All other components are as described with respect to FIG. 1.

Figure 4:
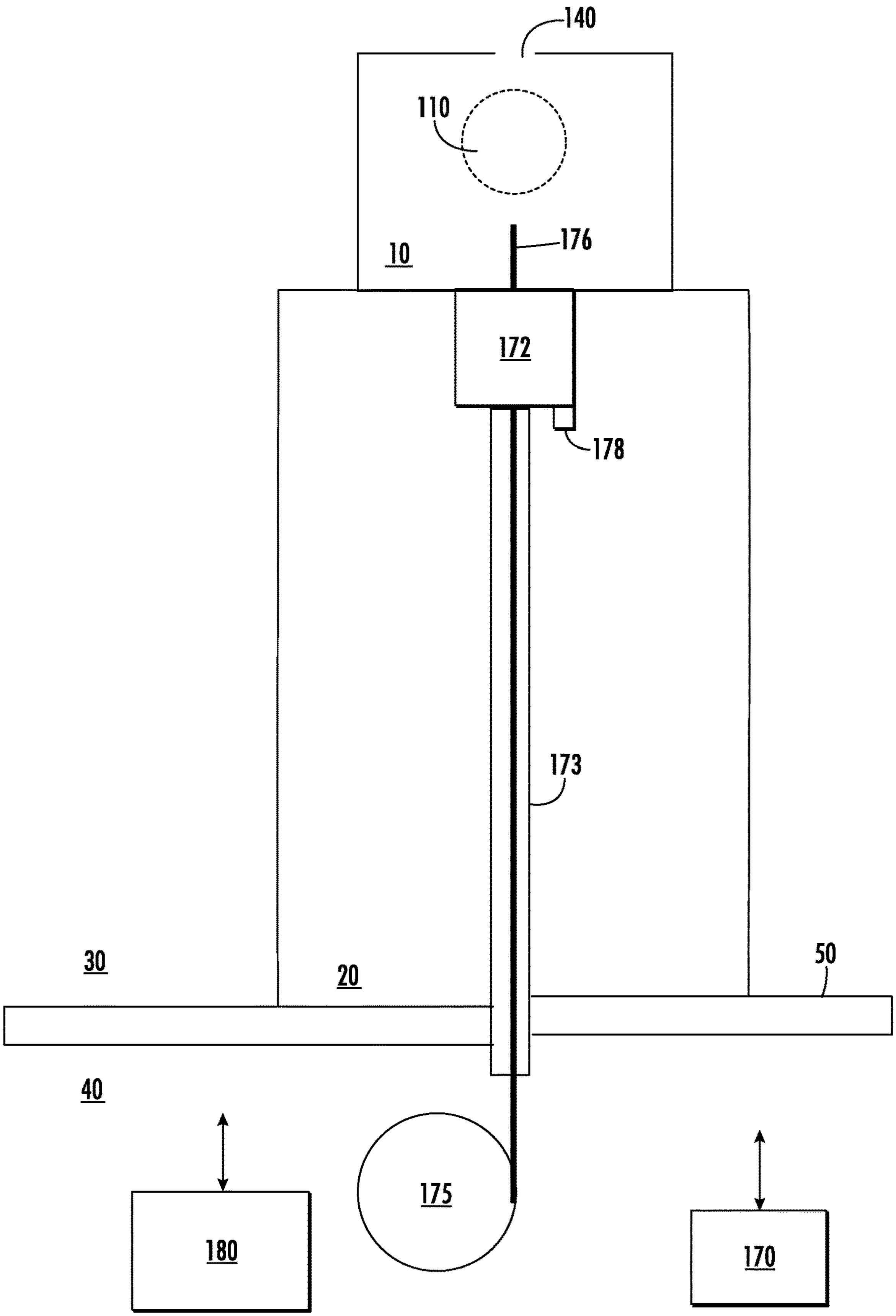
FIG. 4 shows the ion source of FIG. 3 and the base.

FIG. 4 shows a view of the IHC ion source of FIG. 3 disposed on a base 20. As shown in FIG. 4, the material delivery device 175, the controller 180 and the dopant power supply 170 may be disposed in the atmospheric environment 40. In one embodiment, the conduit 173 travels along the outside of the base 20 (similar to as shown in FIG. 2), and then enters the arc chamber 100 through the side wall opposite the extraction plate 103. In other embodiments, such as that shown in FIG. 4, the conduit 173 may be disposed within the base 20 and travel to the arc chamber 100.

Figure 5:
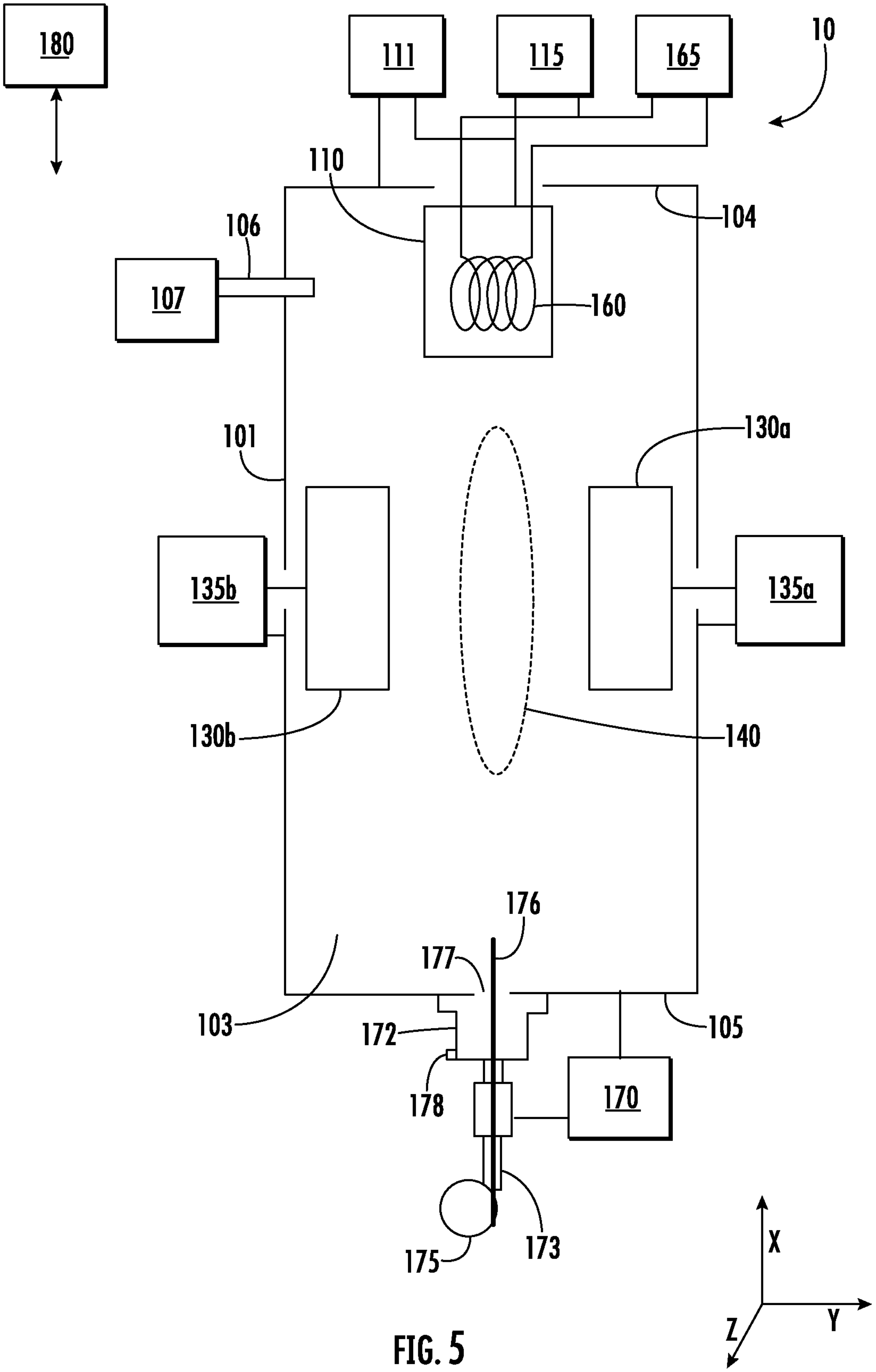
FIG. 5 is an indirectly heated cathode (IHC) ion source with a wire form metal dopant in accordance with a third embodiment.

In another embodiment, the metal dopant 176 may enter the IHC ion source 10 through the opening 177 located on the second end 105. This configuration is shown in FIG. 5. In this embodiment, the repeller is eliminated. In some embodiments, electrodes are utilized. In the embodiment shown in FIG. 5, first electrode **130*a* and second electrode 130*b* may be disposed on respective opposite side walls 101 of the arc chamber 100, such that the first electrode 130*a* and the second electrode 130*b* are within the arc chamber 100. The first electrode 130*a* and the second electrode 130*b* may each be biased by a respective power supply. In certain embodiments, the first electrode 130*a* and the second electrode 130*b* may be in communication with a common power supply. However, in other embodiments, to allow maximum flexibility and ability to tune the output of the IHC ion source 10, the first electrode 130*a* may be in communication with a first electrode power supply 135***a* and the second electrode 130*b* may be in communication with a second electrode power supply 135*b*.

The first electrode power supply 135*a* and the second electrode power supply 135*b* serve to bias the first electrode 130*a* and the second electrode 130*b*, respectively, relative to the side walls 101 of the arc chamber 100. In certain embodiments, the first electrode power supply 135*a* and the second electrode power supply 135*b* may bias the first electrode 130*a* and the second electrode 130*b* positively or negatively relative to the side walls 101 of the arc chamber 100. In certain embodiments, at least one of the electrodes may be biased at between 40 and 500 volts relative to the side walls 101 of the arc chamber 100.

While FIG. 5 shows two electrodes, it is understood that one of these electrodes, such as second electrode 130*b* and its associated second electrode power supply 135*b* may be eliminated in some embodiments. In another embodiment, the second electrode 130*b* is disposed within the arc chamber 100, but is electrically connected to the side walls 101 of the arc chamber 100 or may be electrically floating. Thus, in this embodiment, the second electrode power supply 135*b* may be eliminated.

Note that, in some embodiments that utilize electrodes 130*a*, 130*b*, the cathode 110 may be electrically connected to the side walls 101, such that the arc power supply 111 may be eliminated. The rest of the components in FIG. 5 are as described above. In this embodiment, the configuration of the conduit 173 may be outside the base 20, as shown in FIG. 2, although it enters the arc chamber 100 through a different wall.

For all of these embodiments, the filament power supply 165 passes a current through the filament 160, which causes the filament 160 to emit thermionic electrons. These electrons strike the back surface of the cathode 110, which may be more positive than the filament 160, causing the cathode 110 to heat, which in turn causes the cathode 110 to emit electrons into the arc chamber 100. These electrons collide with the molecules of gas that are fed into the arc chamber 100 through the gas inlet 106. A gas, such as an inert species, such as argon, an etching species, such as fluorine or a fluorine-containing gas, or a combination thereof, may be introduced from the gas source 107 into the arc chamber 100 through a suitably located gas inlet 106. The combination of electrons from the cathode 110, the gas and the positive potential creates plasma. For the embodiments shown in FIGS. 1 and 3, the plasma may be confined by the electrical fields created by the cathode 110 and the repeller 120. For the embodiment shown in FIG. 5, the plasma may be confined and manipulated by the electrical fields created by the first electrode 130*a* and the second electrode 130*b*. In certain embodiments, the electrons and positive ions may also be somewhat confined by the magnetic field. In certain embodiments, the plasma is confined near the center of the arc chamber 100, proximate the extraction aperture 140. Chemical etching or sputtering by the plasma transforms metal dopant 176 into the gas phase and causes ionization. The ionized metal dopant can then be extracted through the extraction aperture 140 and used to create an ion beam.

Figure 6:
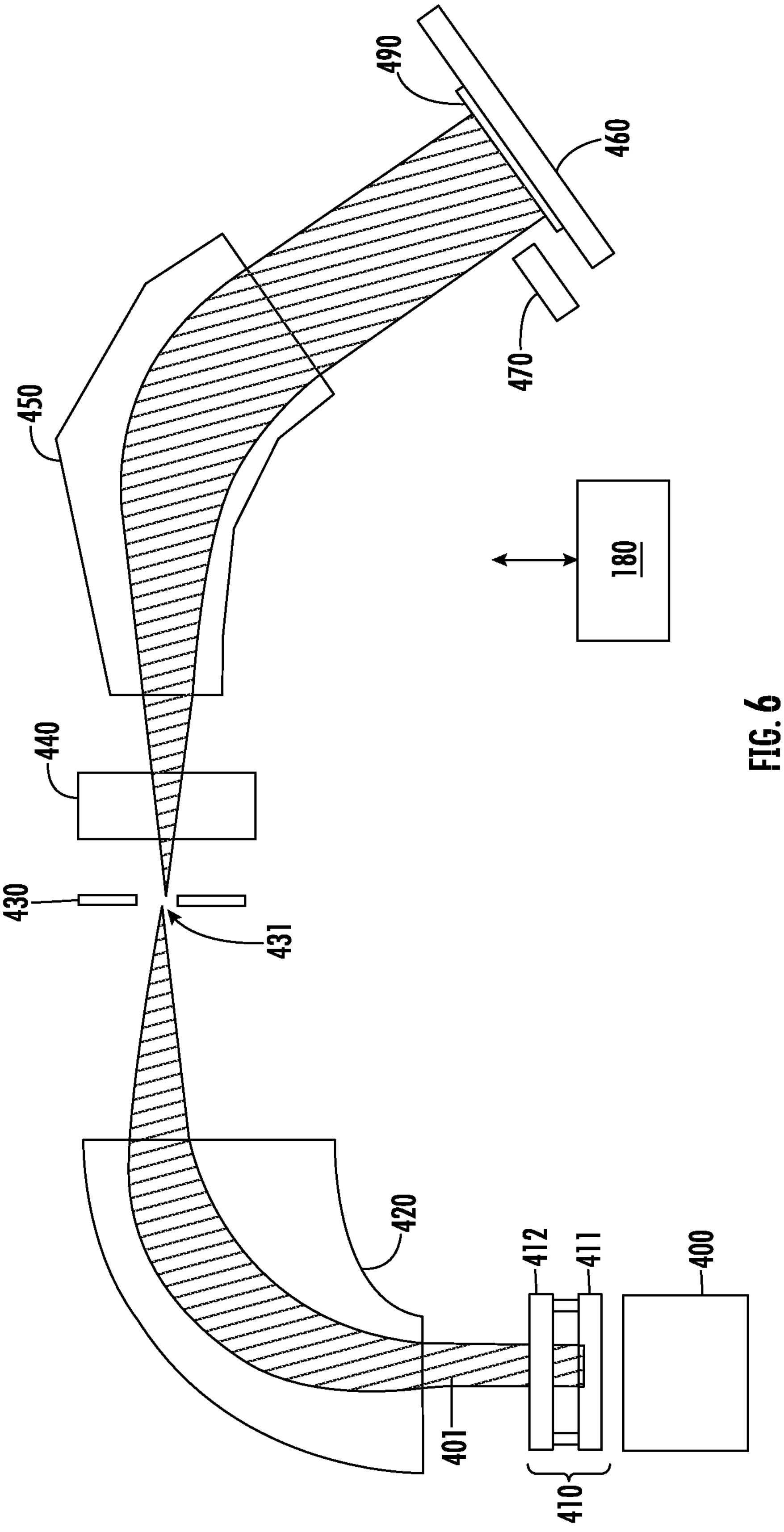
FIG. 6 is an ion implantation system that utilizes any of the ion sources described herein.

FIG. 6 shows an ion implanter that may utilize any of the ion sources described herein. The ion implanter includes an ion source 400, which may be any of the ion sources described above. In certain embodiments, the ion source 400 may be an IHC ion source. In another embodiment, the ion source 400 may be an RF ion source. In this embodiment, an RF antenna may be disposed against a dielectric window. This dielectric window may comprise part or all of one of the chamber walls. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 KW and may be any suitable frequency, such as between 1 and 100 MHZ. Further, the power supplied by the RF power supply may be pulsed. Other embodiments are also possible. For example, the plasma may be generated in a different manner, such as by a Bernas ion source, a capacitively coupled plasma (CCP) source, microwave or ECR (electron-cyclotron-resonance) ion source. The manner in which the plasma is generated is not limited by this disclosure.

One chamber wall, referred to as the extraction plate, includes an extraction aperture. The extraction aperture may be an opening through which the ions 401 generated in the ion source chamber are extracted and directed toward a workpiece 490. The extraction aperture may be any suitable shape. In certain embodiments, the extraction aperture may be oval or rectangular shaped.

Disposed outside and proximate the extraction aperture of the ion source 400 are extraction optics 410. In certain embodiments, the extraction optics 410 comprise one or more electrodes. In certain embodiments, the extraction optics 410 comprises a suppression electrode 411, which is negatively biased relative to the plasma so as to attract ions through the extraction aperture. The suppression electrode 411 may be electrically biased using a suppression power supply. The suppression electrode 411 may be biased so as to be more negative than the extraction plate of the ion source 400.

In some embodiments, the extraction optics 410 includes a ground electrode 412. The ground electrode 412 may be disposed proximate the suppression electrode 411. The ground electrode 412 may be electrically connected to a second electrode power supply. In other embodiments, the ground electrode 412 may be electrically grounded so that the second electrode power supply is not used.

In other embodiments, the extraction optics 410 may comprise in excess of two electrodes, such as three electrodes or four electrodes. In these embodiments, the electrodes may be functionally and structurally similar to those described above, but may be biased at different voltages.

Located downstream from the extraction optics 410 is a mass analyzer 420. The mass analyzer 420 uses magnetic fields to guide the path of the extracted ions 401. The magnetic fields affect the flight path of ions according to their mass and charge. A mass resolving device 430 that has a resolving aperture 431 is disposed at the output, or distal end, of the mass analyzer 420. By proper selection of the magnetic fields, only those ions 401 that have a selected mass and charge will be directed through the resolving aperture 431. Other ions will strike the mass resolving device 430 or a wall of the mass analyzer 420 and will not travel any further in the system.

One or more beamline components may be disposed downstream from the mass resolving device 430 to direct the ions 401 toward the workpiece 490. For example, a collimator 440 may be disposed downstream from the mass resolving device 430. The collimator 440 accepts the extracted ions 401 that pass through the resolving aperture 431 and creates a ribbon ion beam formed of a plurality of parallel or nearly parallel beamlets. In other embodiments, the ion beam may be a spot beam. In this embodiment, an electrostatic scanner is used to move the spot beam in the first direction, as defined below.

Located downstream from the collimator 440 may be an acceleration/deceleration stage 450. The acceleration/deceleration stage 450 may be an electrostatic filter. The electrostatic filter is a beam-line lens component configured to independently control deflection, deceleration, and focus of the ion beam. Located downstream from the acceleration/deceleration stage 450 is the workpiece holder 460.

The workpiece 490, which may be, for example, a silicon wafer, a silicon carbide wafer, or a gallium nitride wafer, is disposed on the workpiece holder 460.

A beam profiler 470 may be disposed near the workpiece holder 460. The beam profiler may be configured to measure the beam current at the location where it strikes the workpiece 490. The beam profiler 470 may be made up of one or more Faraday sensors.

Further, in certain embodiments, the controller 180 is able to monitor and control the metal dopant 176 through control of the material delivery device 175, the dopant power supply 170 and the temperature control device 172.

Specifically, the controller 180 may control the material delivery device 175 so as to advance the metal dopant 176 into the arc chamber 100. The controller 180 may use a variety of different methods to determine the rate at which the metal dopant 176 is delivered to the arc chamber 100. In one embodiment, this rate is determined empirically. In other words, testing is performed with a certain metal dopant and certain other parameters associated with the IHC ion source 10, and a delivery rate is determined based on this testing. In other embodiments, the controller 180 may use information from other parts of the ion implantation system.

For example, the controller 180 may be in communication with the beam profiler 470. When the beam current begins to decrease, this may be indicative of the lack of a sufficient amount of metal dopant 176 within the arc chamber 100. Thus, the controller 180 may actuate the material delivery device 175 to advance more of the metal dopant 176 into the arc chamber 100. In another embodiment, the controller 180 may already use the beam current, as detected by the beam profiler 470, to control other parameters of the ion source, such as the arc voltage, bias voltage or current through the filament 160. Thus, in this embodiment, the controller 180 may monitor a parameter that is indicative of beam current to actuate the material delivery device 175. For example, the controller may use changes in arc voltage or bias voltage to determine when to advance more of the metal dopant 176 into the arc chamber 100. In another embodiment, the controller 180 may sense the current being supplied by the dopant power supply 170, and determine when to advance more of the metal dopant 176 into the arc chamber 100 based on this current. For example, the amount of current may be indicative of the interaction between the plasma and the metal dopant 176, which can then be used to determine when to advance more of the metal dopant 176 into the arc chamber 100.

The controller 180 may control the temperature control device 172 to ensure that the metal dopant 176 is within a desired temperature range when it enters the arc chamber 100. The controller 180 may also receive information from the temperature sensor 178 to detect the actual temperature of the metal dopant 176 as it enters the arc chamber 100. In some embodiments, the controller 180 may control the temperature based on parameters such as the species of the metal dopant 176, the arc power used in the IHC ion source, the bias voltage of the cathode 110, and other parameters.

Further, the controller 180 may also control the voltage applied to the metal dopant 176. For example, the voltage applied to the metal dopant 176 may increase or decrease the interaction between the plasma and the metal dopant 176.

Thus, in some embodiments, the controller 180 may utilize a closed loop control system to control at least one of the parameters associated with the metal dopant 176. These metal dopant related parameters include the rate at which the metal dopant 176 is delivered to the arc chamber 100, the temperature of the metal dopant 176, and the voltage applied to the metal dopant 176. In some embodiments, one or more of these metal dopant parameters may be determined based on the metal species being used and the other parameters associated with the IHC ion source 10. In yet other embodiments, one or more of these metal dopant related parameters is determined empirically, such that the metal dopant related parameter follows a predetermined profile.

In yet another embodiment, one or more of the dopant related parameters may be controlled using open loop control. These parameters may be determined based on a predetermined algorithm or look up table. In another embodiment, the metal dopant 176 may be delivered at a constant rate.

The embodiments described above in the present application may have many advantages. First, the present system allows a solid feed material to be used as a dopant material without the issues associated with the prior art. Secondly, the material delivery device 175 allows controlled introduction of the metal dopant 176 into the arc chamber 100. Since the metal dopant is in the form of a wire, this may reduce the possibility of molten metal being spilled or otherwise deposited within the arc chamber 100. Third, the configuration of the system allows for simple replacement, removal or replenishment of the metal dopant 176 without having to break vacuum in the vacuum chamber 30. This is in contrast to many conventional systems where the supply of the metal dopant is disposed within the vacuum chamber 30 and is replaced by breaking vacuum.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An indirectly heated cathode ion source, comprising:
- an arc chamber, comprising a plurality of electrically conductive side walls connecting a first end and a second end;
- an indirectly heated cathode disposed on the first end of the arc chamber;
- an opening formed on one of the plurality of electrically conductive side walls;
- a material delivery device to deliver a metal dopant in a form of a wire to the arc chamber;
- a conduit through which the wire passes as the wire travels to an interior of the arc chamber through the opening in the arc chamber;

and a temperature control device to heat or cool the metal dopant prior to entering the arc chamber wherein the temperature control device remains disposed outside the arc chamber as the material delivery device delivers the metal dopant to the arc chamber.

2. The indirectly heated cathode ion source of claim 1, wherein the temperature control device contacts the conduit.

3. The indirectly heated cathode ion source of claim 1, wherein the temperature control device comprises one or more heating elements.

4. The indirectly heated cathode ion source of claim 1, wherein the temperature control device comprises one or more cooling elements.

5. The indirectly heated cathode ion source of claim 1, further comprising a temperature sensor located outside the arc chamber to measure a temperature of the metal dopant prior to entering the arc chamber.

6. The indirectly heated cathode ion source of claim 1, further comprising a dopant power supply to apply a voltage to the metal dopant.

7. The indirectly heated cathode ion source of claim 1, wherein a diameter of the wire is between 20 and 70 mils.

8. The indirectly heated cathode ion source of claim 1, wherein the material delivery device comprises a spool on which the wire is wound and a motor for advancing the wire.

9. An ion implanter, comprising:

the indirectly heated cathode ion source of claim 1 to generate an ion beam; and one or more beamline components to direct the ion beam toward a workpiece.

10. The ion implanter of claim 9, further comprising a controller, wherein the controller controls at least one metal dopant related parameter, wherein the metal dopant related parameters include a delivery rate of the wire, a temperature of the wire and a voltage applied to the wire.

11. The ion implanter of claim 10, further comprising a beam profiler to detect a beam current at a location near the workpiece, wherein the controller uses information from the beam profiler to control at least one of the metal dopant related parameters.

12. An indirectly heated cathode ion source, comprising:

an arc chamber, comprising a plurality of electrically conductive side walls connecting a first end and a second end, wherein the second end is opposite the first end;

an indirectly heated cathode disposed on the first end of the arc chamber;

an opening formed on the second end;

a material delivery device to deliver a metal dopant in a form of a wire to the arc chamber;

a conduit through which the wire passes as the wire travels to an interior of the arc chamber through the opening in the arc chamber; and a temperature control device to heat or cool the metal dopant prior to entering the arc chamber wherein the temperature control device remains disposed outside the arc chamber as the material delivery device delivers the metal dopant to the arc chamber.

13. The indirectly heated cathode ion source of claim 12, further comprising a temperature sensor disposed outside the arc chamber to measure a temperature of the metal dopant prior to entering the arc chamber.

14. The indirectly heated cathode ion source of claim 12, further comprising a dopant power supply to apply a voltage to the metal dopant.

15. The indirectly heated cathode ion source of claim 12, wherein a diameter of the wire is between 20 and 70 mils.

16. An ion implanter, comprising:

the indirectly heated cathode ion source of claim 12 to generate an ion beam; and one or more beamline components to direct the ion beam toward a workpiece.

17. The ion implanter of claim 16, further comprising a controller, wherein the controller controls at least one metal dopant related parameter, wherein the metal dopant related parameters include a delivery rate of the wire, a temperature of the wire and a voltage applied to the wire.

18. The ion implanter of claim 17, further comprising a beam profiler to detect a beam current at a location near the workpiece, wherein the controller uses information from the beam profiler to control at least one of the metal dopant related parameters.

* * * * *